United States Patent
Chang et al.

(10) Patent No.: US 9,691,699 B2
(45) Date of Patent: Jun. 27, 2017

(54) CIRCUIT STRUCTURE AND METHOD FOR MANUFACTURING THE SAME

(71) Applicant: Unimicron Technology Corp., Taoyuan (TW)

(72) Inventors: Chia-Chan Chang, Taipei (TW); Gwo-Chaur Chen, Taoyuan (TW); Yung-Tsai Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/931,808

(22) Filed: Nov. 3, 2015

(65) Prior Publication Data

US 2017/0125337 A1    May 4, 2017

(51) Int. Cl.
*H05K 3/10*     (2006.01)
*H01L 23/498*   (2006.01)
*H01L 21/48*    (2006.01)

(52) U.S. Cl.
CPC .... *H01L 23/49866* (2013.01); *H01L 21/4846* (2013.01); *H01L 21/4875* (2013.01); *H01L 23/49811* (2013.01); *H01L 23/49838* (2013.01)

(58) Field of Classification Search
CPC ........ H05K 3/00; H05K 3/108; H05K 3/0058; H05K 3/0064; H05K 3/0067; H01L 23/49866; H01L 23/49811; H01L 23/49838; H01L 21/4846; H01L 21/4875
See application file for complete search history.

(56) References Cited

U.S. PATENT DOCUMENTS

| | | |
|---|---|---|
| 3,324,014 A | 6/1967 | Modjeska |
| 7,707,715 B2 | 5/2010 | Okabe et al. |
| 2007/0119541 A1* | 5/2007 | Kawabata ......... H01L 23/49822 156/307.7 |
| 2015/0373833 A1* | 12/2015 | Baek .................. H05K 3/4682 174/250 |

FOREIGN PATENT DOCUMENTS

TW    201227897    7/2012

OTHER PUBLICATIONS

"Office Action of Taiwan Counterpart Application," issued on Jan. 29, 2016, p. 1-p. 6.

* cited by examiner

*Primary Examiner* — Hoa C Nguyen
(74) *Attorney, Agent, or Firm* — Jianq Chyun IP Office (57) ABSTRACT

A method for manufacturing a circuit structure is described as follows. Two patterned circuit layers are formed on a core layer. The patterned circuit layers are located on two opposite surfaces of the core layer. A patterned insulating layer is respectively formed on each of the patterned circuit layers. The patterned insulating layers respectively expose a portion of the patterned circuit layers. The core layer is removed so as to expose an upper surface of each of the patterned circuit layers and a top surface of each of the patterned insulating layers. The upper surface of each of the patterned circuit layers is aligned with the top surface of each of the patterned insulating layers.

4 Claims, 6 Drawing Sheets

CIRCUIT STRUCTURE AND METHOD FOR MANUFACTURING THE SAME

BACKGROUND OF THE INVENTION

Field of the Invention

The invention relates to a circuit structure and a method for manufacturing the same, and more particularly to a circuit structure applied to Flip Chip Chip Scale Package (FCCSP) and a method for manufacturing the same.

Description of Related Art

Compared with Fan out Wafer Level Package (FOWLP), manufacturing cost required for Flip Chip Chip Size Package (FCCSP) is higher. The reason lies in that a carrier board is not required for FOWLP, which effectively and considerably reduces the manufacturing cost. Therefore, in the trend toward low cost and high added values, how to effectively simplify the manufacturing process and reduce manufacturing cost has become an issue that needs to be overcome for FCCSP.

SUMMARY OF THE INVENTION

A circuit structure and a method for manufacturing the same are provided, which simplify the manufacturing process of the circuit structure and cost lower.

The method of manufacturing the circuit structure of the invention includes the following steps. Two patterned circuit layers are formed on a core layer. The patterned circuit layers are located on two opposite surfaces of the core layer. A patterned insulating layer is respectively formed on each of the patterned circuit layers. The patterned insulating layers respectively expose a portion of the patterned circuit layers. The core layer is removed so as to expose an upper surface of each of the patterned circuit layers and a top surface of each of the patterned insulating layers. The upper surface of each of the patterned circuit layers is aligned with the top surface of each of the patterned insulating layers.

In an embodiment of the invention, the core layer includes a core dielectric layer, two first copper foil layers and two second copper foil layers. The first copper foil layers are located respectively on two opposite side surfaces of the core dielectric layer while the second copper foil layers are located respectively on the first copper foil layers, and a thickness of each of the first copper foil layers is greater than a thickness of each of the second copper foil layers.

In an embodiment of the invention, the method for manufacturing the circuit structure further includes: providing two support plates respectively bonded on the patterned insulating layers after forming the patterned insulating layer respectively on each of the patterned circuit layers and before removing the core layer.

In an embodiment of the invention, the method for manufacturing the circuit structure further includes: forming a seed layer respectively on each of the patterned insulating layers after forming the patterned insulating layer respectively on each of the patterned circuit layers and before removing the core layer, wherein the seed layers cover the patterned insulating layers and the patterned circuit layers exposed by the patterned insulating layers. A patterned process is performed on each of the seed layers to form a patterned seed layer respectively. A patterned build-up circuit layer is formed respectively on each of the patterned seed layers, wherein the patterned build-up circuit layers are disposed respectively on the patterned seed layers and are connected to the patterned circuit layers via the patterned seed layers. A patterned build-up insulating layer is formed respectively on each of the patterned build-up circuit layers, and the patterned build-up insulating layers respectively expose a portion of the patterned build-up circuit layers.

In an embodiment of the invention, the method for manufacturing the circuit structure further includes: providing two support plates respectively bonded on the patterned build-up insulating layers after forming the patterned build-up insulating layer respectively on each of the patterned build-up circuit layers and before removing the core layer.

The circuit structure of the invention includes a patterned circuit layer and a patterned insulating layer. The patterned insulating layer covers a portion of the patterned circuit layer, wherein an upper surface of the patterned circuit layer is aligned with a top surface of the patterned insulating layer.

In an embodiment of the invention, the circuit structure further includes a support plate disposed on a bottom surface of the patterned insulating layer.

In an embodiment of the invention, the circuit structure further includes: a patterned seed layer covering the patterned insulating layer and a portion of the patterned circuit layer; a patterned build-up circuit layer, disposed on the patterned seed layer, wherein the patterned build-up circuit layer is connected to the patterned circuit layer via the patterned seed layer; and a patterned build-up insulating layer, exposing a portion of the patterned build-up circuit layer.

In an embodiment of the invention, the circuit structure further includes: a support plate, disposed on a bottom surface of the patterned build-up insulating layer.

In an embodiment of the invention, the patterned seed layer is an electroplated copper layer.

In view of the above, the method for manufacturing the circuit structure of the invention is able to manufacture a circuit structure having merely a single circuit layer, which thereby reduces considerable time for manufacturing the circuit structure and effectively reduces manufacturing cost.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1A:
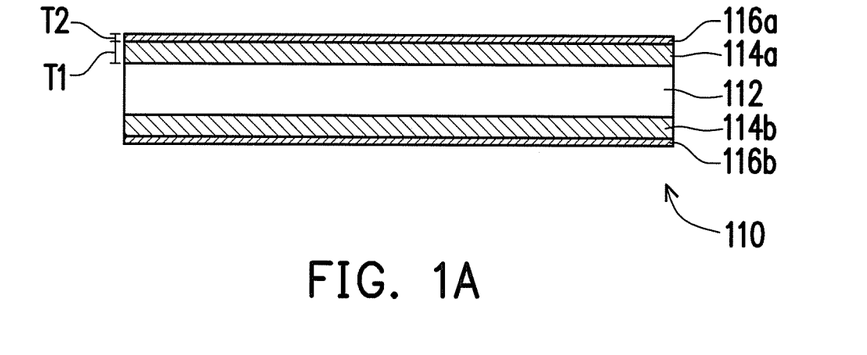
FIGS. 1A to 1G are schematic cross-sectional views of a method for manufacturing a circuit structure according to an embodiment of the invention.
Figure 1B:
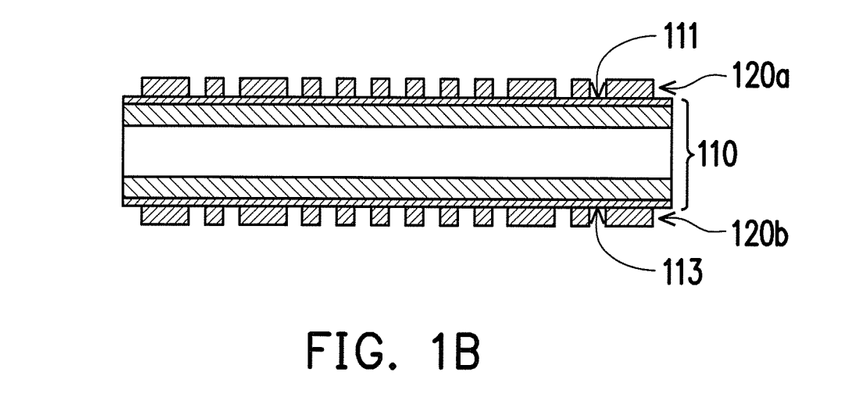

FIGS. 1A to 1G are schematic cross-sectional views of a method for manufacturing a circuit structure according to an embodiment of the invention. Referring to FIG. 1B about the method for manufacture the circuit structure in this embodiment, two patterned circuit layers 120a and 120b are first formed on a core layer 110, wherein the patterned circuit layers 120a and 120b are located respectively on two opposite surfaces 111 and 113 of the core layer 110.

More specifically, referring to FIG. 1A, the core layer 110 includes a core dielectric layer 112, two first copper foil layers 114a and 114b and two second copper foil layers 116a and 116b. The first copper foil layers 114a and 114b are located respectively on two opposite side surfaces 112a and 112b of the core dielectric layer 112 while the second copper foil layers 116a and 116b are located respectively on the first copper foil layers 114a and 114b, and a thickness T1 of each of the first copper foil layers 114a (or 114b) is greater than a thickness T2 of each of the second copper foil layers 116a (or 116b). Herein, the thickness T1 of the first copper foil layers 114a (or 114b) is, for example, 18 micrometers while the thickness T2 of the second copper foil layer 116a (or 116b) is, for example, 3 micrometers, but the invention is not limited thereto.

Referring further to FIG. 1B, the patterned circuit layers 120a and 120b are located respectively on the two opposite surfaces 111 and 113 of the core layer 110, wherein the patterned circuit layers 120a and 120b respectively expose the surfaces 111 and 113 of a portion of the core layer 110. Herein, the method for forming the patterned circuit layers 120a and 120b is by arranging a electroplating mask (not shown) on the surfaces 111 and 113 of the core layer 110. The second copper foil layers 116a and 116b of the core layer 110 are electroplated seed layers which forms the patterned circuit layers 120a and 120b via electroplating. The electroplating mask is removed afterwards to complete the manufacturing of the patterned circuit layer 120a and 120b, but the invention is not limited thereto.

Figure 1C:
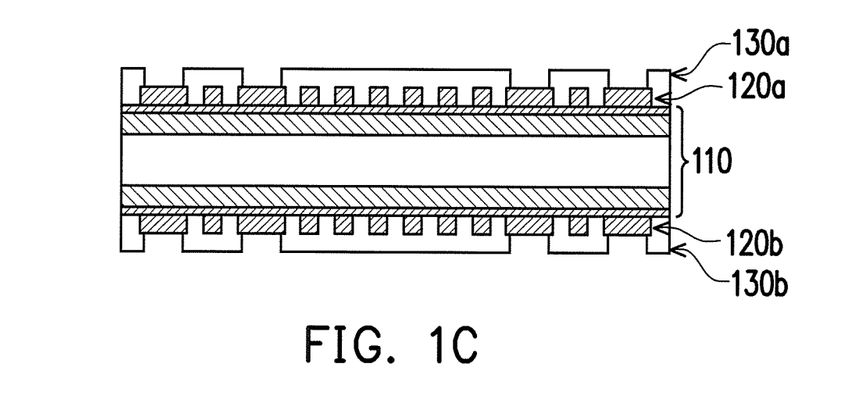

Next, referring to FIG. 1C, a patterned insulating layer 130a or 130b is formed respectively on each of the patterned circuit layers 120a and 120b, wherein the patterned insulating layers 130a and 130b respectively exposes a portion of the patterned circuit layers 120a and 120b. Herein, the patterned insulating layers 130a and 130b are formed by, for example, first coating an insulating material layer (not shown) on the patterned circuit layers 120a and 120b and performing steps of photoresist coating (not shown), exposure and development on the insulating material layer once to complete manufacturing of the patterned insulating layers 130a and 130b, but the invention is not limited thereto.

Figure 1D:
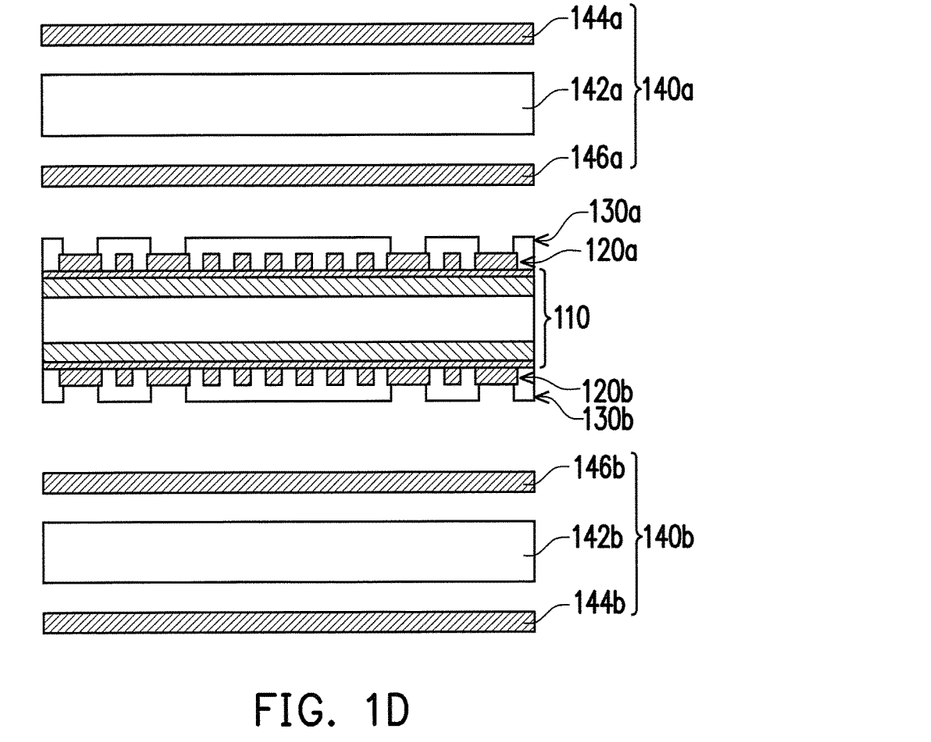
Figure 1E:
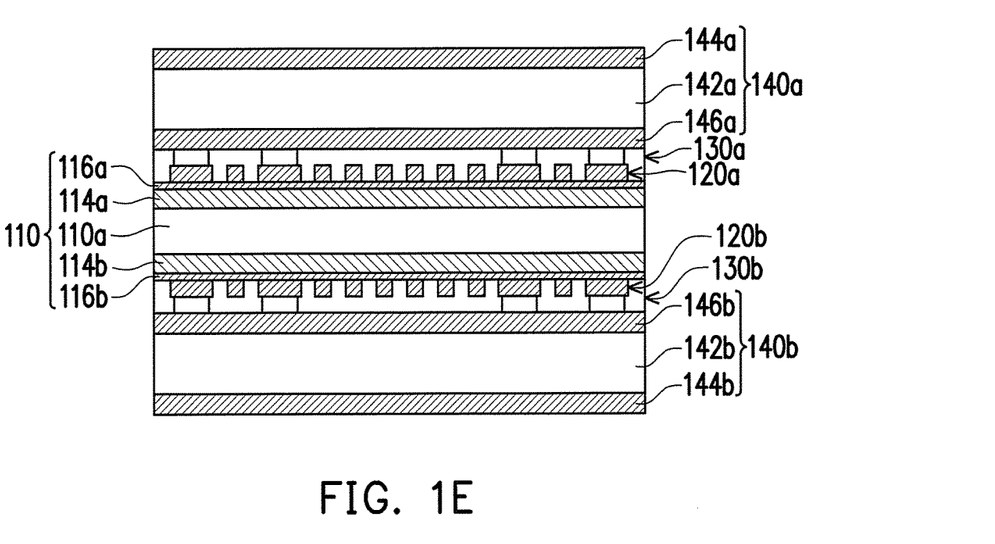

Next, referring to both FIGS. 1D and 1E, two support plates 140a and 140b are provided, respectively bonded on the patterned insulating layers 130a and 130b, wherein each of the support plates 140a (or 140b) includes a B-level insulating layer 142a (or 142b) and two copper foil layers 144a and 146a (or 144b and 146b), the copper foil layers 144a and 146a (or 144b and 146b) are located respectively on two opposite side surfaces of the B-level insulating layer 142a (or 142b), and the copper foil layer 144b (or 146b) of each support plate 140a (or 140b) directly contacts the corresponding patterned insulating layer 130a and 130b.

It is worth noting that the core layer of the support plate 140a (or 140b) herein is specifically the B-level insulating layer 142a (or 142b), i.e. a semi-cured insulating layer, which thereby has more preferable binding force when bonding the support plates 140a and 140b on the patterned insulating layers 130a and 130b by means of thermocompression bonding. In addition, warpage phenomenon of the copper foil layers 144a, 146a, 144b and 146b of the support plates 140a and 140b with respect to the B-level insulating layers 142a and 142b is also improved and avoided.

Figure 1F:
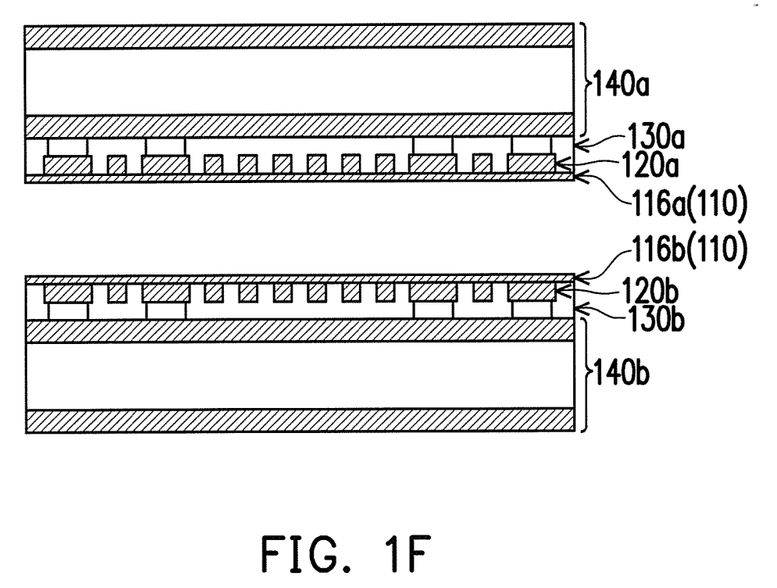
Figure 1G:
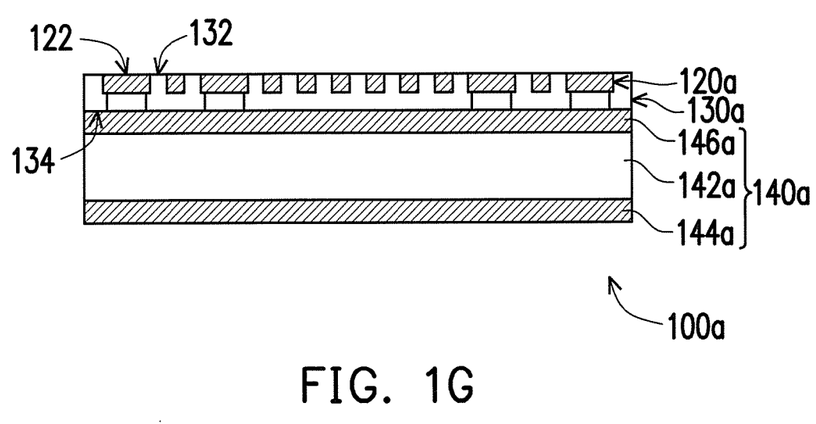

Then, referring to both FIGS. 1F and 1G, the core layer 110 is removed, so as to expose an upper surface 122 of each of the patterned circuit layers 120a and a top surface 132 of each of the patterned insulating layers 130a. The upper surface 122 of each of the patterned circuit layers 120a is aligned with the top surface 132 of each of the patterned insulating layers 130a. It should be noted that for the convenience of description, after the core layer 110 is removed, FIG. 1G merely schematically illustrates one circuit structure 100a.

More specifically, referring to both FIGS. 1E and 1F, the core dielectric layer of the core layer 110 is separated from the first copper foil layers 114a and 114b and the second copper foil layers 116a and 116b by lift-off, but the invention is not limited thereto.

At this point, as shown in FIG. 1F, only the second copper foil layers 116a and 116b are left to directly contact the patterned insulating layers 130a and 130b and the patterned circuit layers 120a and 120b. Then, referring to both FIGS. 1F and 1G, the second copper foil layers 116a and 116b of the core layer 110 is removed by etching to expose the upper surface 122 of the patterned circuit layer 120a and the top surface 132 of the patterned insulating layer 130a. The core layer 110 has been removed so far, and the circuit structure 100a has been manufactured.

Structurally, referring again to FIG. 1F, the circuit structure 100a of this embodiment includes the patterned circuit layer 120a and the patterned insulating layer 130a. The patterned insulating layer 130a covers a portion of the patterned circuit layer 120a, wherein the upper surface 122 of the patterned circuit layer 120a is aligned with the top surface 132 of the patterned insulating layer 130a. Herein, the upper surface 122 of the patterned circuit layer 120a and the top surface 132 of the patterned insulating layer 130a may serve as a chip bonding surface, and chips (not shown) may be bonded to this chip bonding surface in subsequent processes.

Furthermore, the circuit structure 100a of this embodiment may further include support plates 140a, disposed on a bottom surface 134 of the patterned insulating layer 130a, wherein the support plate 140a includes a B-level insulating layer 142a and two copper foil layers 144a and 146a, the copper foil layers 144a and 146a are located respectively on two opposite side surfaces of the B-level insulating layer 142a, and the copper foil layer 146a directly contacts the bottom surface 134 of the patterned insulating layer 130a. Herein, the purpose of the support plate 140a is to support the patterned circuit layer 120a and the patterned insulating layer 130a, so that the circuit structure 100a in this embodiment has more preferable structural reliability. It should be noted that the support plate 140a may also be removed after the subsequent packaging process, so as to obtain a product having a thinner package thickness. At this point, the bottom surface 134 of the patterned insulating layer 130a exposed after removing the support plate 140a may serve as a Ball Grid Array (BGA) bonding surface, which is suitable for bonding a plurality of solder balls (not shown).

Since the method for manufacturing the circuit structure in this embodiment is able to manufacture a circuit structure 100a having a single circuit layer, considerable time is reduced for manufacturing the circuit structure 100a, which incurs lower manufacturing cost.

To enhance wiring density of the circuit structure 100a, schematic cross-sectional views of partial steps in another method for manufacturing a circuit structure is provided in FIGS. 2A to 2F. The method for manufacturing the circuit structure in this embodiment is similar to the method for manufacturing the circuit structure in FIGS. 1A to 1G, and the primary difference between the two lies in: after the step of FIG. 1B, i.e. after forming the patterned circuit layers 120a and 120b on the core layer 110, referring to FIG. 2A, the insulating material layer 130 is coated on the patterned circuit layer 120a and 120b, wherein the insulating material layer 130 completely covers the patterned circuit layers 120a and 120b and the surfaces 111 and 113 of the core layer 110 exposed by the patterned circuit layers 120a and 120b.

Figure 2A:
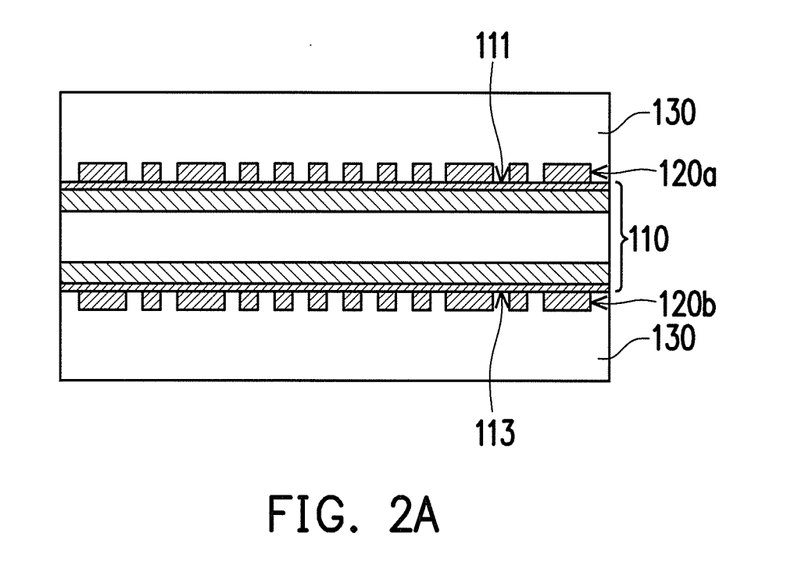
FIGS. 2A to 2F are schematic cross-sectional views of partial steps in a method of manufacturing a circuit structure according to another embodiment of the invention.
Figure 2B:
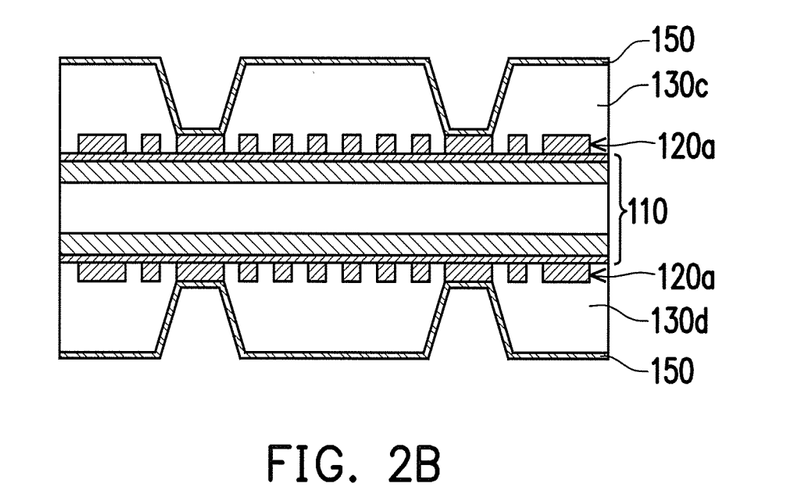

Next, referring to FIG. 2B, steps of photoresist coating (not shown), exposure and development are performed on the insulating material layer 130 once to complete manufacturing of patterned insulating layers 130c and 130d.

Next, referring to FIG. 2B, a seed layer 150 is formed respectively on each of the patterned insulating layers 130c and 130d, and the seed layer 150 covers the patterned insulating layers 130c and 130d and the patterned circuit layers 120a and 120b exposed by the patterned insulating layers 130c and 130d. Herein, the seed layer 150 is formed, for example, by means of electroplating.

Figure 2C:
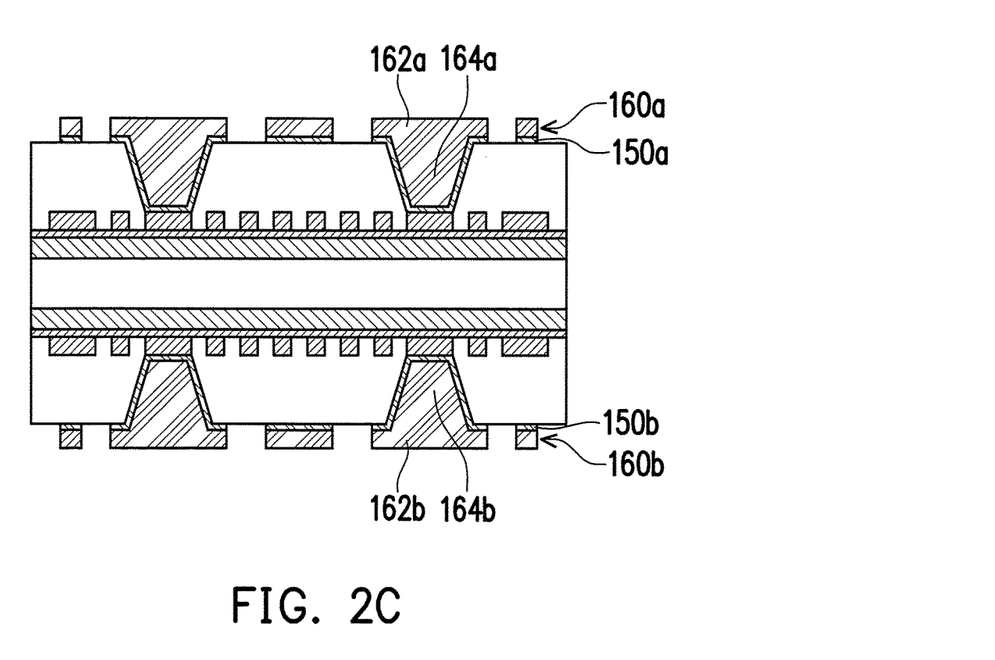
Figure 2D:
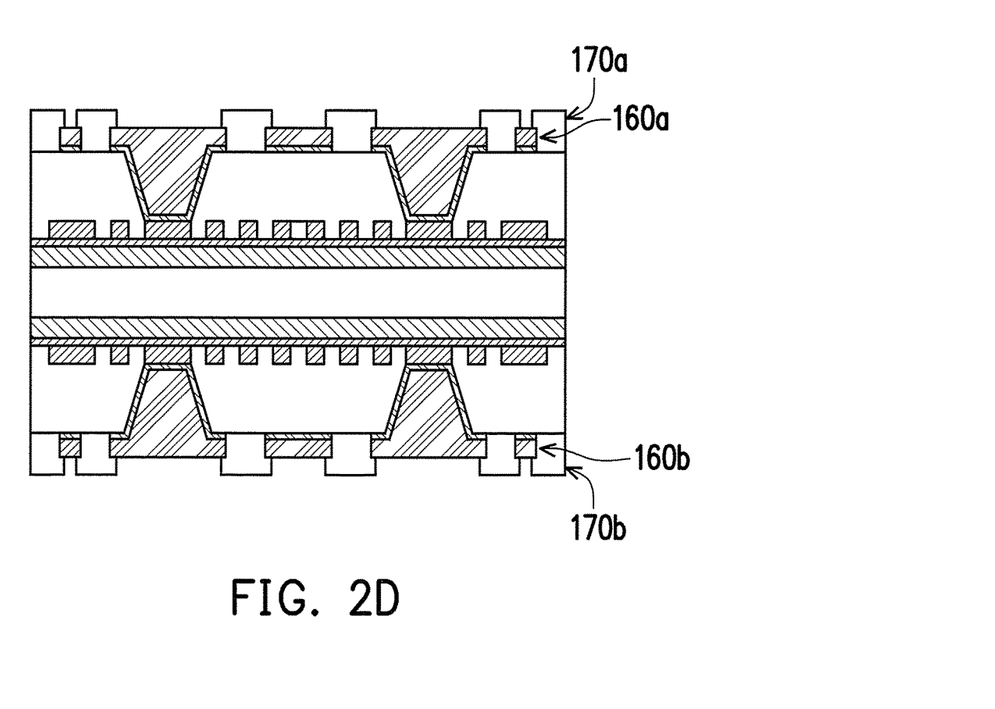

Next, referring to FIG. 2C, a patterned process is performed on the seed layer 150 to form a patterned seed layer 150a and a patterned seed layer 150b. Herein, the patterned seed layers 150a and 150b are, for example, an electroplated copper layer. Next, a patterned build-up circuit layer 160a or 160b is formed respectively on each of the patterned seed layers 150a and 150b, wherein the patterned build-up circuit layers 160a and 160b are disposed respectively on the patterned seed layers 150a and 150b and are connected to the patterned circuit layers 120a and 120b via the patterned seed layers 150a and 150b. As shown in FIG. 2C, the patterned build-up circuit layer 160a and 160b are composed of patterned circuit layers 162a and 162b and conductive vias 164a and 164b connecting the patterned circuit layers 162a and 162b and the patterned circuit layers 120a and 120b. Herein, the method for forming the patterned build-up circuit layers 160a and 160b uses, for example, the patterned seed layers 150a and 150b as the electroplated seed layer, so as to form the circuit layers (not shown) by means of electroplating. Next, referring to FIG. 2D, a patterned build-up insulating layer 170a or 170b is formed respectively on each of the patterned build-up circuit layers 160a and 160b, wherein the patterned insulating layers 170a and 170b respectively exposes a portion of the patterned build-up circuit layers 160a and 160b. Herein, the patterned build-up insulating layers 170a and 170b are formed by, for example, first coating an insulating material layer (not shown) on the patterned build-up circuit layers 160a and 160b and performing steps of photoresist coating (not shown), exposure and development on the insulating material layer once to complete manufacturing of the patterned build-up insulating layers 170a and 170b, but the invention is not limited thereto.

Figure 2E:
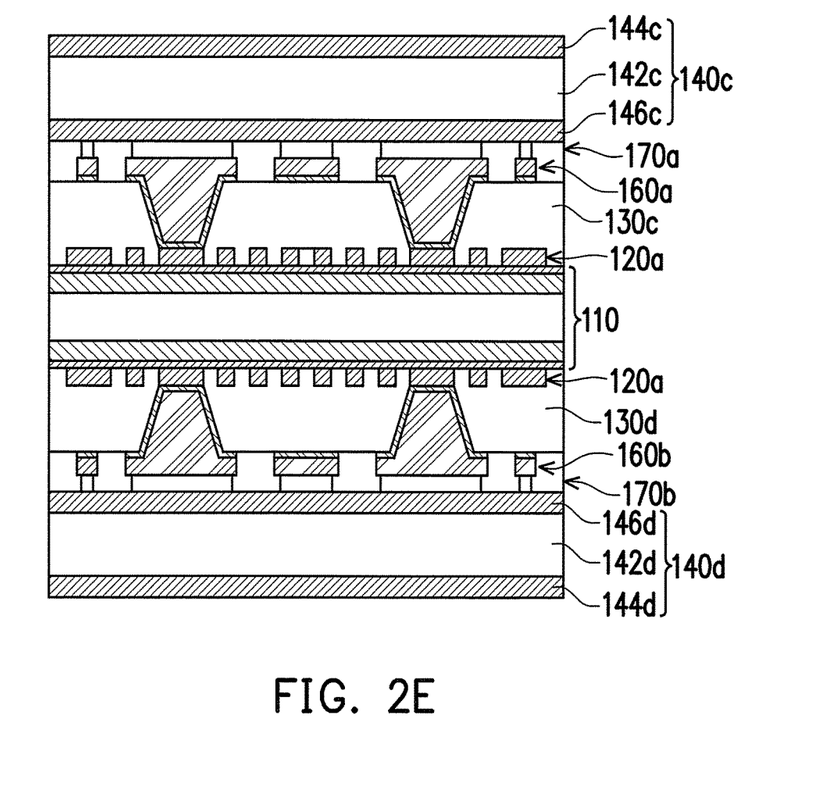

Next, same as the steps in FIGS. 1D and 1E, that is, two support plates 140c and 140d are provided, wherein the support plates 140c and 140d are respectively bonded on the patterned build-up insulating layers 170a and 170b while the copper foil layers 144c and 146c (or 144d and 146d) of the support plate 140c (or 140d) are located respectively on two opposite side surfaces of a B-level insulating layer 142c (or 142d), and the copper foil layer 146c (or 146d) of the support plate 140c (or 140d) directly contacts the corresponding patterned build-up insulating layers 170a and 170b, referring to FIG. 2E.

It is worth noting that the core layer of the support plate 140c (or 140d) herein is specifically the B-level insulating layer 142c (or 142d), i.e. a semi-cured insulating layer, which thereby has more preferable bonding force when bonding the support plates 140c and 140d on the patterned build-up insulating layers 170a and 170b by means of thermocompression bonding. In addition, warpage phenomenon of the copper foil layers 144c, 146c, 144d and 146d of the support plates 140c and 140d with respect to the B-level insulating layers 142c and 142d is also improved and avoided.

Figure 2F:
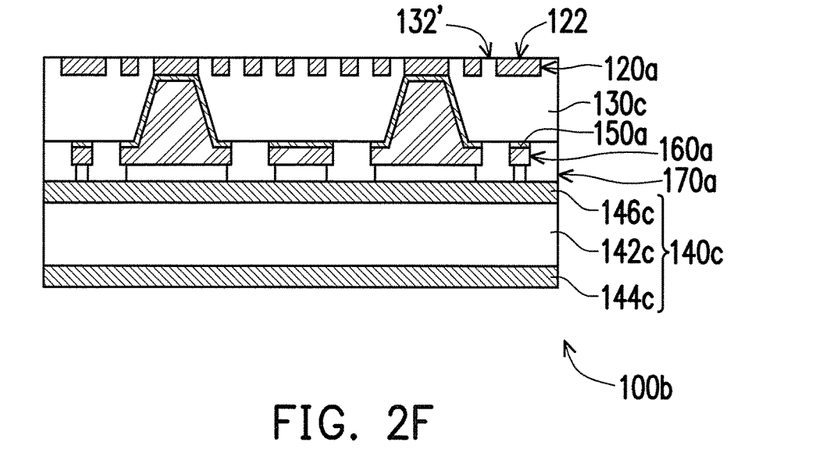

Afterwards, same as the implementing steps in FIGS. 1F and 1G, the core layer 110 is removed to exposed an upper surface 122 of each patterned circuit layer 120a and a top surface 132' of each patterned insulating layer 130c, wherein the upper surface of each patterned circuit layer 120a is aligned with the top surface 132' of each patterned insulating layer 130c, referring to both FIGS. 2E and 2F. It should be noted that for the convenience of description, after the core layer 110 is removed, FIG. 2F merely schematically illustrates one circuit structure 100b. So far, the circuit structure 100b has been manufactured.

Structurally, referring again to FIG. 2F, the circuit structure 100b of this embodiment is composed of the patterned circuit layer 120a, the patterned insulating layer 130c, the patterned seed layer 150a, the patterned build-up circuit layer 160a and the patterned build-up insulating layer 170a. The patterned insulating layer 130c covers a portion of the patterned circuit layer 120a, wherein the upper surface 122 of the patterned circuit layer 120a is aligned with the top surface 132' of the patterned insulating layer 130c. Herein, the upper surface 122 of the patterned circuit layer 120a and the top surface 132' of the patterned insulating layer 130c may serve as a chip bonding surface, and chips (not shown) may be bonded to this chip bonding surface in subsequent processes. The patterned seed layer 150a covers the patterned insulating layer 130c and a portion of the patterned circuit layer 120a. The patterned build-up circuit layer 160a is disposed on the patterned seed layer 150a, wherein the patterned build-up circuit layer 160a is connected to the patterned circuit layer 120a via the patterned seed layer 150a. The patterned build-up insulating layer 170a exposes a portion of the patterned build-up circuit layer 160a.

Furthermore, the circuit structure 100b of this embodiment may further include support plates 140c, disposed on a bottom surface 172 of the patterned build-up insulating layer 170a, wherein the support plate 140c includes the B-level insulating layer 142c and two copper foil layers 144c and 146c, the copper foil layers 144c and 146c are located respectively on two opposite side surfaces of the B-level insulating layer 142c, and the copper foil layer 146c directly contacts the bottom surface 172 of the patterned build-up insulating layer 170a. It should be noted that the support plate 140c may also be removed after the subsequent packaging process, so as to obtain a product having a thinner package thickness.

In view of the above, since the method for manufacturing the circuit structure of the invention is able to manufacture a circuit structure having a single circuit layer, considerable time is reduced for manufacturing the circuit structure, which incurs lower manufacturing cost. Furthermore, to enhance the wiring density of the circuit structure, the patterned build-up circuit layer and the patterned build-up insulating layer may also be manufactured on the circuit structure of the single circuit layer, so as to enhance applicability of the circuit structure.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A method for manufacturing a circuit structure, comprising:
   forming two patterned circuit layers on a core layer, wherein the patterned circuit layers are located respectively on two opposite surfaces of the core layer;
   forming a patterned insulating layer respectively on each of the patterned circuit layers, wherein the patterned insulating layers respectively expose a portion of the patterned circuit layers;
   providing two support plates respectively bonded on the patterned insulating layers wherein each of the support plates, each of the patterned insulating layers and each of the patterned circuit layers define a plurality of air gaps; and
   after providing the two support plates, removing the core layer so as to expose an upper surface of each of the patterned circuit layers and a top surface of each of the patterned insulating layers, wherein the upper surface of each of the patterned circuit layers is aligned with the top surface of each of the patterned insulating layers.

2. The method for manufacturing the circuit structure as claimed in claim 1, wherein the core layer comprises a core dielectric layer, two first copper foil layers and two second copper foil layers, the first copper foil layers are disposed respectively on two opposite side surfaces of the core dielectric layer, the second copper foil layers are disposed respectively on the first copper foil layers, and a thickness of each of the first copper foil layers is greater than a thickness of each of the second copper foil layers.

3. A method for manufacturing a circuit structure, comprising:
   forming two patterned circuit layers on a core layer, wherein the patterned circuit layers are located respectively on two opposite surfaces of the core layer;
   forming a patterned insulating layer respectively on each of the patterned circuit layers, wherein the patterned insulating layers respectively expose a portion of the patterned circuit layers;
   forming a seed layer respectively on each of the patterned insulating layers, wherein the seed layers cover the patterned insulating layers and the patterned circuit layers exposed by the patterned insulating layers;
   performing a patterned process on each of the seed layers to form a patterned seed layer respectively;
   forming a patterned build-up circuit layer respectively on each of the patterned seed layers, wherein the patterned build-up circuit layers are disposed respectively on the patterned seed layers and are connected to the patterned circuit layers via the patterned seed layers;
   forming a patterned build-up insulating layer respectively on each of the patterned build-up circuit layers, wherein the patterned build-up insulating layers respectively expose a portion of the patterned build-up circuit layers;
   providing two support plates respectively bonded on the patterned build-up insulating layers, wherein each of the support plates, each of the patterned build-up insulating layers, and each of the patterned build-up circuit layers define a plurality air gaps; and
   after providing the two support plates, removing the core layer so as to expose an upper surface of each of the patterned circuit layers and a top surface of each of the patterned insulating layers, wherein the upper surface of each of the patterned circuit layers is aligned with the top surface of each of the patterned insulating layers.

4. The method for manufacturing the circuit structure as claimed in claim 3, wherein the core layer comprises a core dielectric layer, two first copper foil layers and two second copper foil layers, the first copper foil layers are disposed respectively on two opposite side surfaces of the core dielectric layer, the second copper foil layers are disposed respectively on the first copper foil layers, and a thickness of each of the first copper foil layers is greater than a thickness of each of the second copper foil layers.

* * * * *